(12) United States Patent
Kim et al.

(10) Patent No.: US 9,608,313 B2
(45) Date of Patent: Mar. 28, 2017

(54) ON-CHIP WAVEGUIDE FEEDER FOR MILLIMETER WAVE ICS AND FEEDING METHODS, AND MULTIPLE INPUT AND OUTPUT MILLIMETER WAVE TRANSCEIVER SYSTEM USING SAME

(71) Applicant: RESEARCH & BUSINESS FOUNDATION SUNGKYUNKWAN UNIVERSITY, Suwon-si (KR)

(72) Inventors: Byung Sung Kim, Suwon-si (KR); Cheng Lin Cui, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 15/096,743

(22) Filed: Apr. 12, 2016

(65) Prior Publication Data
US 2016/0301125 A1 Oct. 13, 2016

(30) Foreign Application Priority Data
Apr. 13, 2015 (KR) .................. 10-2015-0051923

(51) Int. Cl.
| | | |
|---|---|---|
| *H01Q 1/24* | (2006.01) | |
| *H01L 23/66* | (2006.01) | |
| *H01Q 1/22* | (2006.01) | |
| *H01Q 13/06* | (2006.01) | |

(52) U.S. Cl.
CPC ............ *H01Q 1/243* (2013.01); *H01L 23/66* (2013.01); *H01Q 1/2283* (2013.01); *H01Q 13/065* (2013.01); *H01L 2223/6627* (2013.01)

(58) Field of Classification Search
CPC .. H01Q 1/243; H01Q 1/2283; H01Q 13/0208; H01Q 13/065; H01L 23/6627
USPC ..................... 343/761, 786, 781 R
See application file for complete search history.

(56) References Cited

U.S. PATENT DOCUMENTS

| | | | | |
|---|---|---|---|---|
| 4,873,534 A * | 10/1989 | Wohlleben | ........... | H01Q 13/065 343/761 |
| 5,886,671 A * | 3/1999 | Riemer | ..................... | H01Q 1/28 342/368 |
| 7,002,528 B2 * | 2/2006 | Moheb | ............... | H01Q 13/0208 343/781 R |
| 8,730,119 B2 * | 5/2014 | Runyon | ............. | H01Q 13/0216 343/786 |

(Continued)

FOREIGN PATENT DOCUMENTS

| | | |
|---|---|---|
| JP | 2002-76241 A | 3/2002 |
| JP | 2003-347809 A | 12/2003 |

(Continued)

OTHER PUBLICATIONS

Korean Office Action issued on Nov. 24, 2015 in counterpart Korean Patent Application No. 10-2015-0051923 (5 pages, in Korean).

*Primary Examiner* — Sonny Trinh
(74) *Attorney, Agent, or Firm* — NSIP Law

(57) ABSTRACT

Provided is a waveguide feeder. The waveguide feeder includes: a probe aligned at a center of a waveguide aperture at a metal wiring layer of a semiconductor substrate to input and output an electric signal; and an open stub located at a contact surface of a waveguide flange on a ground surface of a semiconductor chip in order to form a ground path of the probe on a surface of the waveguide flange.

18 Claims, 18 Drawing Sheets

(56) References Cited

U.S. PATENT DOCUMENTS 9,437,913 B2 * 9/2016 Yatabe ...................... H01P 3/16

FOREIGN PATENT DOCUMENTS

| JP | 2011-199692 A | 10/2011 |
| KR | 10-0951183 B1 | 4/2010 |

* cited by examiner

ON-CHIP WAVEGUIDE FEEDER FOR MILLIMETER WAVE ICS AND FEEDING METHODS, AND MULTIPLE INPUT AND OUTPUT MILLIMETER WAVE TRANSCEIVER SYSTEM USING SAME

CROSS-REFERENCE TO RELATED APPLICATIONS

This application claims the benefit of priority of Korean Patent Application No. 10-2015-0051923 filed on Apr. 13, 2015, all of which are incorporated by reference in their entirety herein.

BACKGROUND OF THE INVENTION

Field of the invention

The present invention relates to a waveguide feeder. More particularly, the present invention relates to a low-loss broadband on-chip waveguide feeder having a new structure manufactured on a semiconductor substrate, application and a mounting method thereof, and millimeter wave multi-channel transceiver systems using the same.

Related Art

In a general millimeter wave system, a signal of a millimeter wave transceiving chip is connected to a low-loss substrate using a flip-chip or a wire bonding, and a planar antenna formed on a low-loss substrate is operated or a waveguide feeder is manufactured on the low-loss substrate so that the waveguide is operated. Up to now, there are no examples of an on-chip waveguide feeder in researches with respect to a millimeter wave transceiving chip using a silicon process. There are various researches for radiating an electromagnetic wave to an outside the chip by manufacturing an antenna on a silicon substrate. This is used for the antenna but there are no examples used as a waveguide feeder. In order to use an on-chip antenna according to the related art is used as a waveguide feeder, an on-chip ground should be connected to a waveguide flange. To this end, a wire bond, a flip-chip bond or a via formed through a semiconductor substrate should be used. An on-chip waveguide feeder has been used in a chemical compound semiconductor field. However, in order to electrically connect a waveguide flange to an on-chip ground surface, a rear via formed through the semiconductor substrate is used. Since the rear via requires an additional process, it is impossible to implement the rear via in a silicon standard process.

SUMMARY OF THE INVENTION

The present invention easily implements single or multi-channel millimeter wave transceiver systems which ensure a non-conductive ground path by a ground surface of a waveguide aperture on which a semiconductor chip is mounted in a ground of a semiconductor substrate without using a flip chip, a precise wire bonding, or a rear via formed through the semiconductor substrate in a millimeter integrated circuit and simply drive a horn antenna or a waveguide antenna without expensive complicated millimeter wave packaging by feeding an electromagnetic wave to a waveguide using an on-chip probe. The feeder is applicable to drive an aperture antenna or an aperture coupled transmission line formed on a dielectric substrate or a planar array antenna connected thereto. Accordingly, planar single or multi-channel millimeter wave transceiver systems may be implemented without precise millimeter wave packaging.

In an aspect, a waveguide feeder is provided. The waveguide feeder includes: a probe provided on a semiconductor substrate to radiate or receive an electromagnetic wave; and an open stub provided at an on-chip ground surface in order to provide a ground path of the probe on a metallic substrate on which a chip is provided or a ground metal surface of a waveguide.

The open stub may have a butterfly shape or a rectangular shape, and a signal node may be connected to the probe.

The open stub and the probe may be alone formed on a conductive layer of a metal wiring layer during a semiconductor process or may be configured by connecting a plurality of metal layers to each other through a via. The open stub may be connected on the semiconductor substrate through a contact via.

The open stub may have a length of L2, the length L2 is adjusted to configure a short circuit with the waveguide flange surface under a chip when a termination of the open stub is viewed from a drive point of a center of the open stub.

The probe may be electrically insulated from the open stub.

The probe may have a linear type single pole structure or a U shaped double pole form.

The semiconductor substrate may be located at a center of the waveguide aperture rightward and leftward and may be aligned at an upper blade surface of the open stub and a bottom surface of the aperture of the waveguide upward and downward.

A metal reflector may be installed at a point spaced apart from the aperture of the waveguide by a predetermined distance D, and the distance D is adjusted according to an operation frequency.

In another aspect, a feeding method of a metallic aperture feeder is provided. The method includes: inputting and outputting an electric signal using a probe provided at an aperture; and forming a ground path of the probe on an aperture flange surface through an open stub provided at a contact surface of a metallic aperture flange, wherein the probe and the open stub are formed at a metal wiring layer on the semiconductor substrate.

In another aspect, a transmitter module embedding an on-chip aperture feeder is provided. The transmitter module includes: an on-chip aperture feeder configured to input and output a millimeter wave signal to and from an aperture; a power amplifier connected to the aperture feeder to amplify a signal; a low noise amplifier, a frequency mixer; and a frequency synthesizer configured to receive a reference signal to provide the millimeter wave signal.

In a transmission chip and a reception chip embedding the on-chip aperture feeder, an aperture formed on a metallic surface may be used as a single antenna or may be used by attaching a waveguide slot antenna or a horn antenna for high gain.

The transmission chip and the reception chip embedding the on-chip aperture feeder may drive a transmission line which is located at a rear surface through an aperture formed at a front surface of a dielectric substrate.

A millimeter wave system having a plurality of transceiving channels may be configured by arranging a plurality of transmission chips and reception chips embedding the on-chip aperture feeder in one dimension form, two dimension form, or a conformal form.

In accordance with the on-chip waveguide feeder for silicon millimeter wave chip and a feeding method, and a multiple input and output millimeter wave transceiver using the same, a millimeter wave signal can be radiated or received through the waveguide by attaching only a chip embedding the on-chip waveguide feeder to an aperture of the waveguide. When the chip is attached, even if tolerance is generated, degradation of the characteristics is not great so that a plurality of millimeter wave transmission/reception channels can be easily configured at a low cost.

Further, since the millimeter signal output to the waveguide can be radiated at a high gain and a high efficiency using only a waveguide aperture antenna or using a horn antenna with a high gain or a waveguide slot array antenna, the present invention can be used for various millimeter wave sensors and communication systems such as a multiple channel phased array radar system, a multiple input and output transceiving system, and a high rate wireless digital data transmitting system.

DESCRIPTION OF EXEMPLARY EMBODIMENTS

Figure 1:
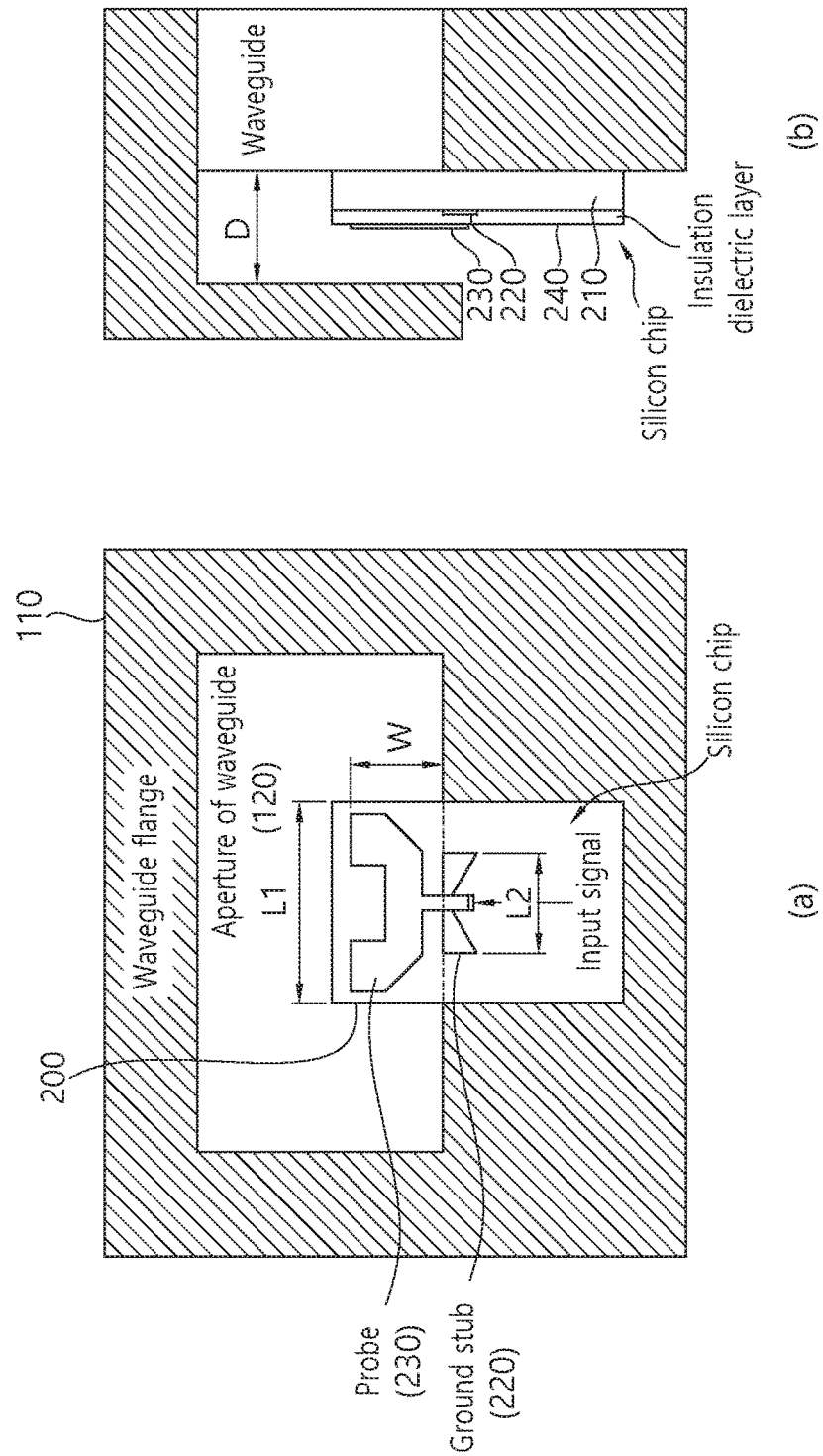
FIG. 1 is a diagram illustrating a structure of a waveguide feeder and a lay-out structure of a waveguide flange surface according to an embodiment of the present invention.

Rather, these example embodiments are provided so that this disclosure will be thorough and complete, and will fully convey the scope of the present inventive concept to those skilled in the art.

However, the embodiment is not limited to the specific embodiment, but the embodiment includes all modifications, equivalents, and substitutes belonging to the technical scope of the embodiment without departing from the spirit of the embodiment.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

In addition, when a component is referred to as being "connected to" or "linked to" another component, the component may be directly connected to or linked to another component or an intervening component may be present therebetween. In contrast, if a component is referred to as being "directly connected to" or "directly linked to" another component, an intervening component may not be present therebetween.

The terms used in the specification are for the purpose of explaining specific embodiments and have no intention to limit the disclosure. Unless the context indicates otherwise, the singular expression may include the plural expression. In the following description, the term "include" or "has" will be used to refer to the feature, the number, the step, the operation, the component, the part or the combination thereof without excluding the presence or addition of one or more features, the numbers, the steps, the operations, the components, the parts or the combinations thereof.

Unless defined otherwise, the terms including technical and scientific terms used in this specification may have the meaning that can be commonly apprehended by those skilled in the art. The terms, such as the terms defined in the commonly-used dictionary, must be interpreted based on the context of the related technology and must not be interpreted ideally or excessively.

Hereinafter, exemplary embodiments will be described in more detail with reference to accompanying drawings. In the following description, for the illustrative purpose, the same components will be assigned with the same reference numerals, and the repetition in the description about the same components will be omitted in order to avoid redundancy.

FIG. 1 is a diagram illustrating a structure of a waveguide feeder and a lay-out structure of a waveguide flange surface according to an embodiment of the present invention. As shown in FIG. 1, a waveguide feeder 200 according to an embodiment of the present invention may include a silicon substrate 210, a ground stub 220, a probe 230, and an insulation dielectric layer 240.

Referring to FIG. 1(b), the ground stub 220 and the insulation dielectric layer 240 may be provided on the silicon substrate 210, and the probe 230 may be provided on the insulation dielectric layer 240. Since a general waveguide feeder should share a ground with a wall of a waveguide but a silicon standard process does not use a rear via, it is impossible to connect the ground of the chip to the wall of the waveguide.

Referring to FIG. 1(a), according to the structure of the waveguide feeder 200, an open stub 220 having a butter fly shape of a length L2 is provided at a contact surface between the silicon chip and a waveguide flange 110 so that a ground path of the probe 230 may be theoretically formed on a waveguide flange 100 surface. An upper blade of the open stub 220 aligns with a waveguide aperture 120. The open stub 220 is formed at the conductive layer of a silicon wiring and may be connected to the silicon substrate 210 through a via. A length L2 of the open ground stub 220 may be adjusted to electrically configure a short circuit with a wavelength flange 110 surface when a termination of the open stub 220 is viewed from a drive point of a center of the open stub 220.

Further, the probe 230 receives a signal input (may be an electric signal) to release an electromagnetic wave to the waveguide aperture 120 or receives the electromagnetic wave through the aperture 210 to output the received electromagnetic wave as an electric signal. In particular, in order to obtain broadband properties, the probe 230 may include two poles having a U shape, and the L1 and the W are adjusted according to a required operation frequency and bandwidth. The probe 230 is located at the aperture 210 of the waveguide and is electrically insulated from the open stub 220 and may be located at a wiring layer. According to the embodiment of the present invention, unlike a probe having a general rectangular shape or a straight shape, the probe 230 is provided parallel to the open stub 220 of a length L2 by a predetermined length so that a slot line mode may be formed. Further, the open stub 220 may include two poles having a U shape at a termination of the open stub 220. Through the above structure, the open stub 220 may flow current to the probe 230 through the probe 230 and the slot mode line mode while providing a ground. Distribution of an electric field formed by the slot line mode may partially operate a basic mode TE10 of the waveguide. In addition, the TE10 mode may be operated by configuring two poles at the termination of the probe 230.

Figure 2:
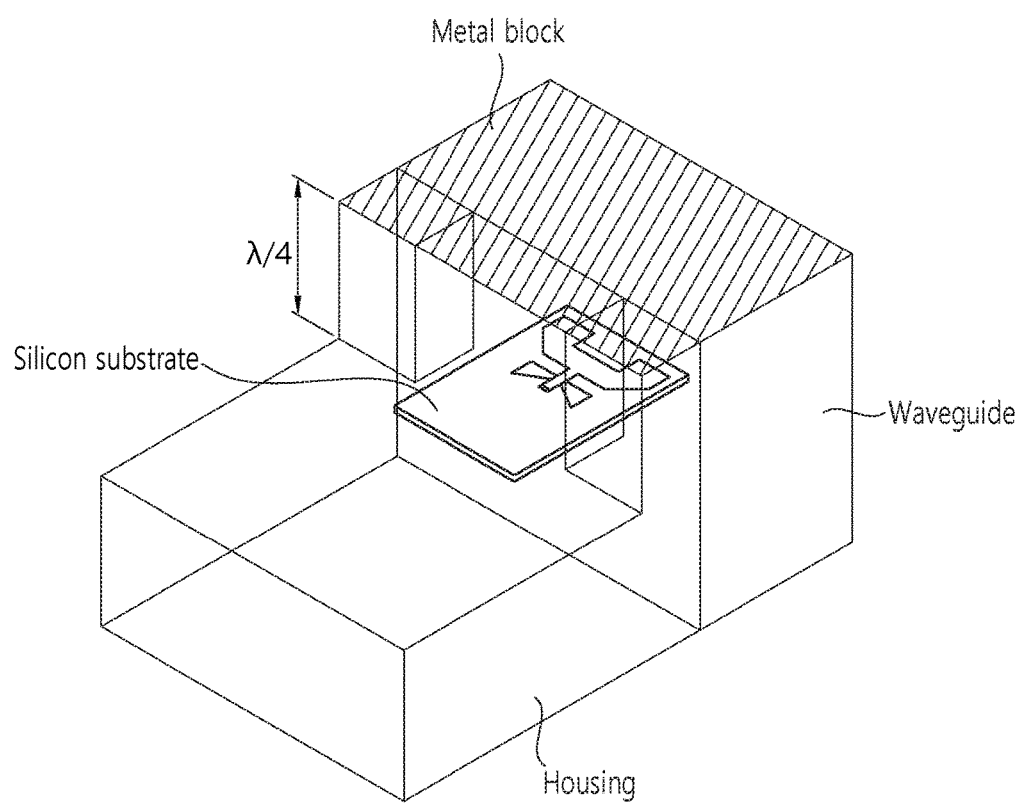
FIG. 2 is a diagram illustrating an attached appearance of a waveguide in the waveguide feeder according to an embodiment of the present invention.

FIG. 2 is a diagram illustrating an attached appearance of a waveguide in the waveguide feeder according to an embodiment of the present invention.

Referring to FIG. 2, a waveguide feeder on a silicon substrate may be attached on an aperture of the waveguide where a probe and a ground stub are arranged on a chip. In this case, a top surface of the waveguide may be formed by a metal block. In addition, a height of the aperture is designed to have a length within a quarter of wavelength $\lambda$ of an electromagnetic wave and permittivity $\epsilon_r$ of the semiconductor substrate may be adjusted according to a thickness of the semiconductor substrate.

A silicon chip including the feeder may be located at a center of the waveguide aperture rightward and leftward and may align an upper blade surface of the open stub and a bottom surface of the aperture of the waveguide upward and downward. A main radiation direction of the feeder is achieved through a rear surface of the silicon substrate so that an electromagnetic wave is moved through the waveguide. Since rear radiation is partially generated in a front surface of a metal layer of the feeder, in order to increase an efficiency by reflecting the rear radiation, a metal reflector may be installed at a point spaced apart from the aperture of the waveguide by a predetermined distance D as shown in a side view of FIG. 1(b). In this case, the length D may be also optimized according to an operation frequency.

Figure 3:
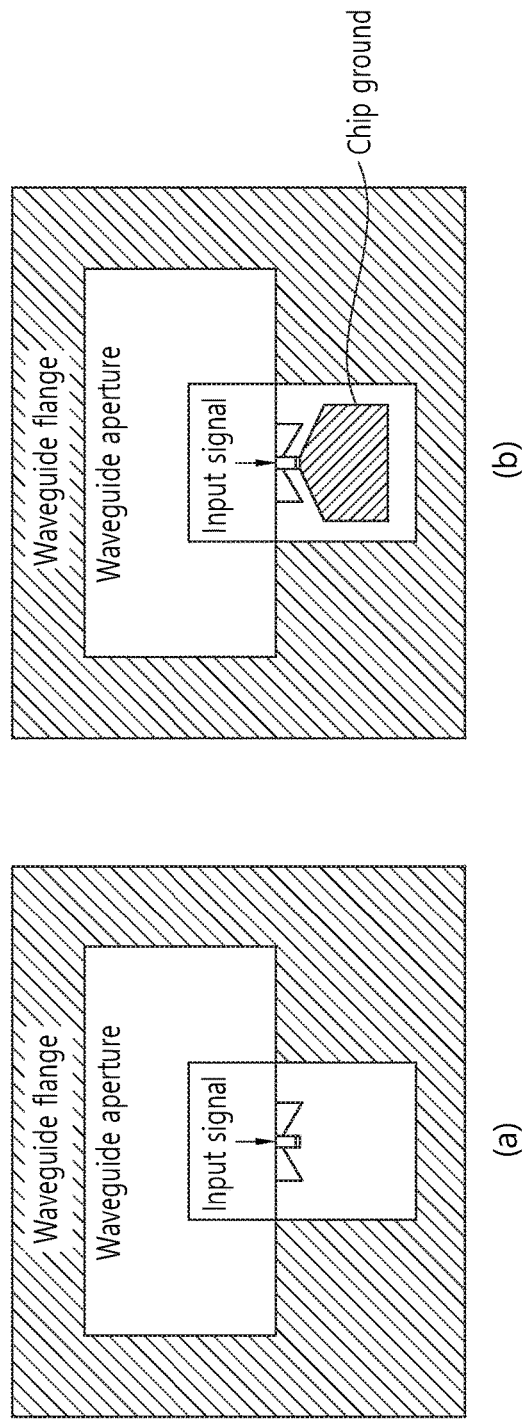
FIG. 3 is a diagram illustrating a simulation structure for inspecting effectiveness of an open ground stub of the waveguide feeder according to an embodiment of the present invention.

FIG. 3 is a diagram illustrating a simulation structure for inspecting effectiveness of an open ground stub of the waveguide feeder according to an embodiment of the present invention.

Referring to FIG. 3(a) and (b), when viewed from a center driving point of the stub based on a waveguide flange surface, it may be configured whether to form a ground path through an impedance value.

Figure 4:
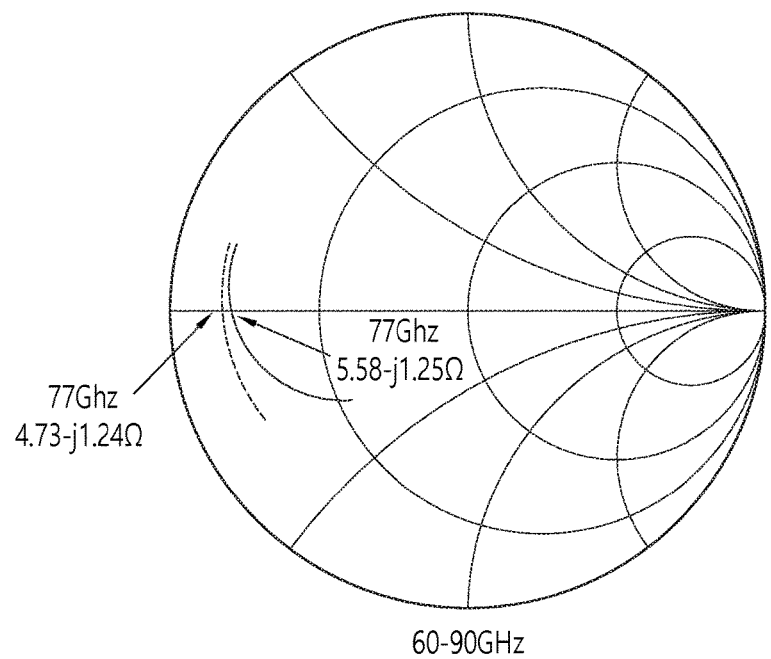
FIG. 4 is a diagram illustrating impedance provided from an open ground stub based on a waveguide flange surface when the impedance and a chip ground are included.

FIG. 4 is a diagram illustrating impedance provided from a ground stub based on a waveguide flange surface when the impedance and a chip ground are included.

Referring to FIG. 4, an experimental result of FIG. 3 may be known. In detail, it may be confirmed to form a ground path having low impedance about 4 to 5Ω. Low ground impedance may be ensured regardless of presence or the size of the on-chip ground surface.

According to an embodiment of the present invention, a wave impedance of the waveguide may have a very great value of 400Ω. In this case, an on-chip input and output may be generally designed as 50Ω. Accordingly, if matching is performed as it is, the on-chip input and output has a very great impedance conversion rate so that the matching is difficult. Although the matching is performed, a bandwidth may be narrow. Accordingly, it is preferably to use a structure of driving two poles by a slot line mode as illustrated in FIG. 1. Accordingly, broadband properties may be represented by reducing the impedance conversion rate while reducing substrate loss. The sizes L1, W, and S of the probe may be optimized to obtain an optimal performance according to an operation frequency like L2.

Figure 5:
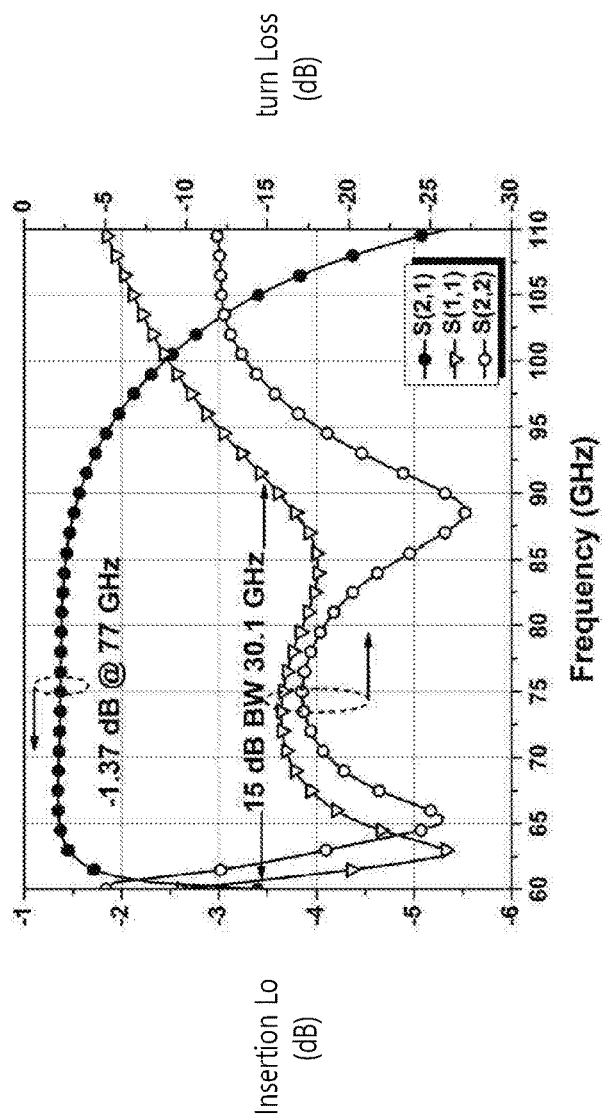
FIG. 5 is a graph illustrating an input matching and transfer characteristics of a silicon on-chip waveguide feeder.

FIG. 5 is a graph illustrating an input matching and transfer characteristics of a silicon on-chip waveguide feeder.

Referring to FIG. 5, as a simulation result by applying the structure of FIG. 1 to a structure of a WR10 waveguide, if the waveguide feeder is included in a port 1 and a waveguide output is a port 2, a 15 dB return loss band is 30.1 GHz based on an input reflection coefficient. Insertion loss is increased in a low frequency due to a low frequency block characteristic of the waveguide so that a substantial bandwidth is wider. Loss of 1.27 dB may be represented in 77 GHz based on the permittivity of the silicon and resistivity of 10Ω. cm.

Figure 6:
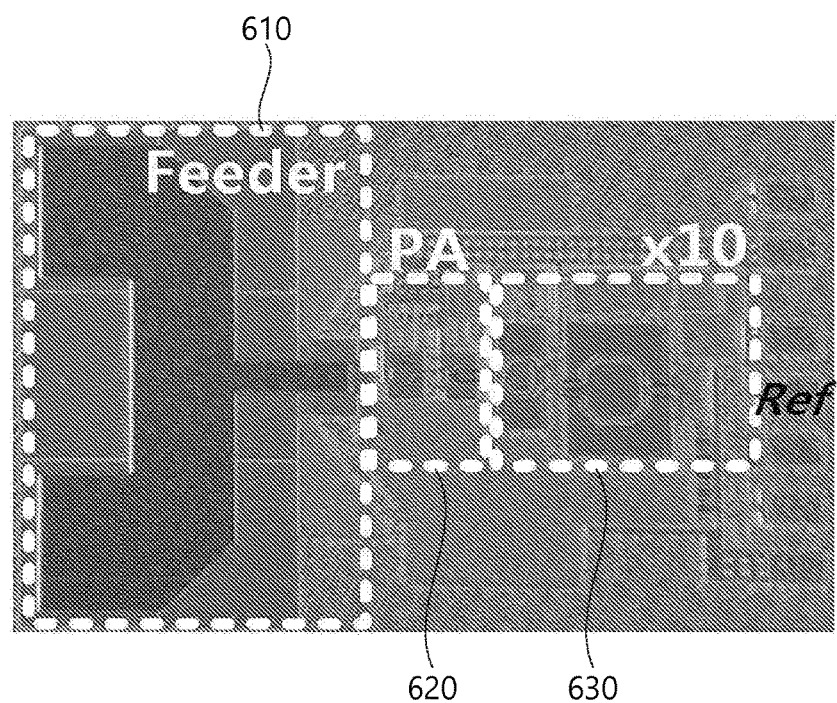
FIG. 6 is a diagram illustrating a manufactured example of a 77 GHz transmitter chip embedding the on-chip waveguide feeder.

FIG. 6 is a diagram illustrating a manufactured example of a 77 GHz transmitter chip embedding the on-chip waveguide feeder.

Referring to FIG. 6, a feeder 610 including a probe and a ground stub having a butter fly shape is connected to a power (PA) amplifier 620 on a silicon chip. Further, the power amplifier 620 may be connected to a frequency divider 630. Accordingly, if the frequency divider 630 divides a reference signal Ref among signals input to the frequency divider 630 to transfer the divided reference signal to the power amplifier 620, the power amplifier 620 may amplify the received signal by preset amplitude to transfer the amplified signal to the feeder 610. The feeder 610 may transfer a received millimeter wave signal to the waveguide to transmit the signal to the exterior.

Figure 7:
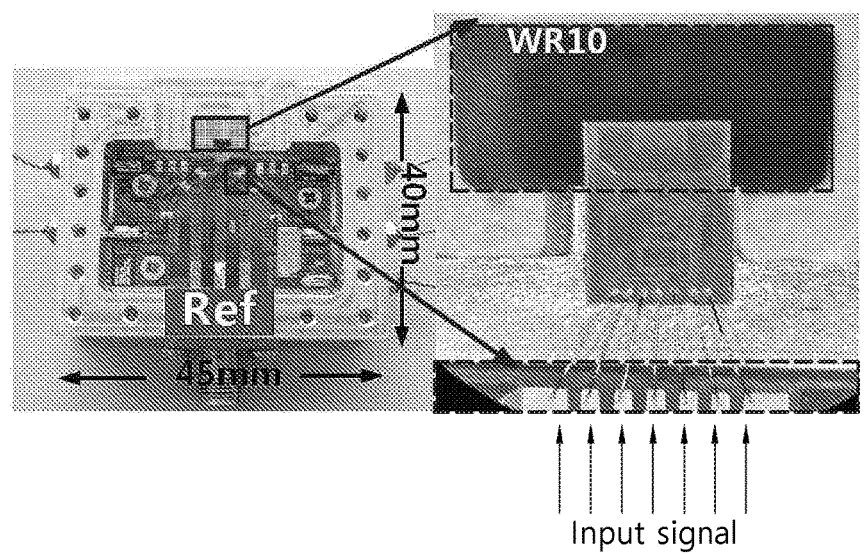
FIG. 7 is a diagram illustrating a mounted example of an aperture of a waveguide in a transmitter chip embedding an on-chip waveguide feeder and a configuration of a transmitter module using the same.

FIG. 7 is a diagram illustrating a mounted example of an aperture of a waveguide in a transmitter chip embedding an on-chip waveguide feeder and a configuration of a transmitter module using the same.

Referring to FIG. 7, a transmitter chip may embed a power amplifier and a frequency divider to transfer the millimeter wave signal to the waveguide through the feeder. External signals include a reference signal and a bias signal of the frequency divider. Referring to a left drawing of FIG. 7, an input signal is provided to the frequency divider through a bonding wire. In some cases, the input signal may be a signal for supplying power.

Accordingly, since there is no input and output of the millimeter wave signal through an external line, a millimeter wave transmitter may be configured by a wire bonding and an FR4 substrate at a low cost. Performance of a transmitter module using an on-chip waveguide feeder is illustrated in FIG. 8.

Figure 8:
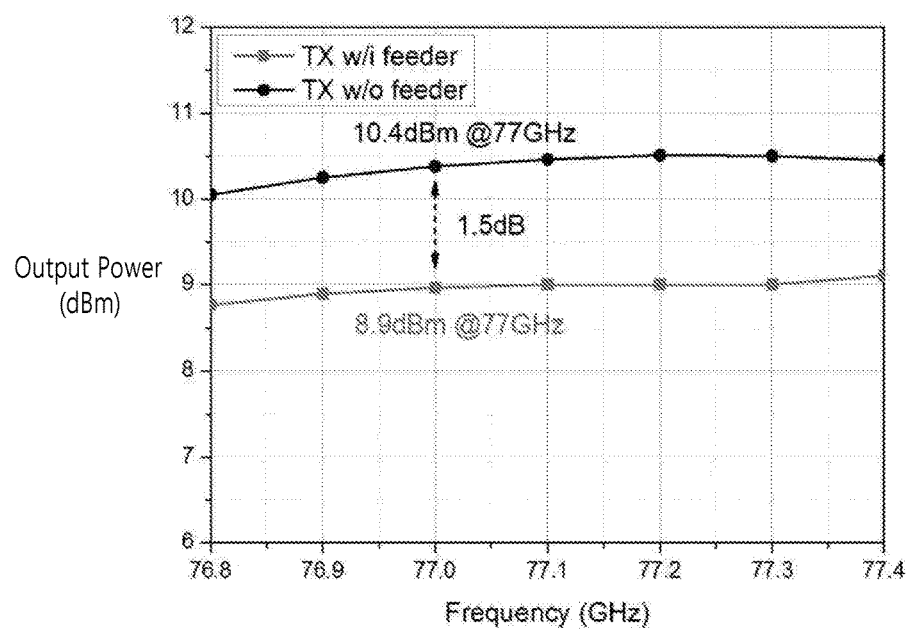
FIG. 8 is a diagram of comparing (wafer measurement) performance of a transmission chip embedding an on-chip waveguide feeder with that of a chip embedding a pad.

FIG. 8 is a diagram of comparing (wafer measurement) performance of a transmission chip embedding an on-chip waveguide feeder with that of a chip embedding a pad.

Referring to FIG. 8, when comparing with output power measured using a wafer probing by attaching an input and output pad without a feeder, it may be confirmed that an output of a waveguide using the feeder is reduced by about 1.5 dB. However, loss of a system using the waveguide feeder is very lower than a case of implementing a system configured by generally bonding an output pad in a millimeter wave chip. Accordingly, the present invention may very simply realize a millimeter wave module.

Figure 9:
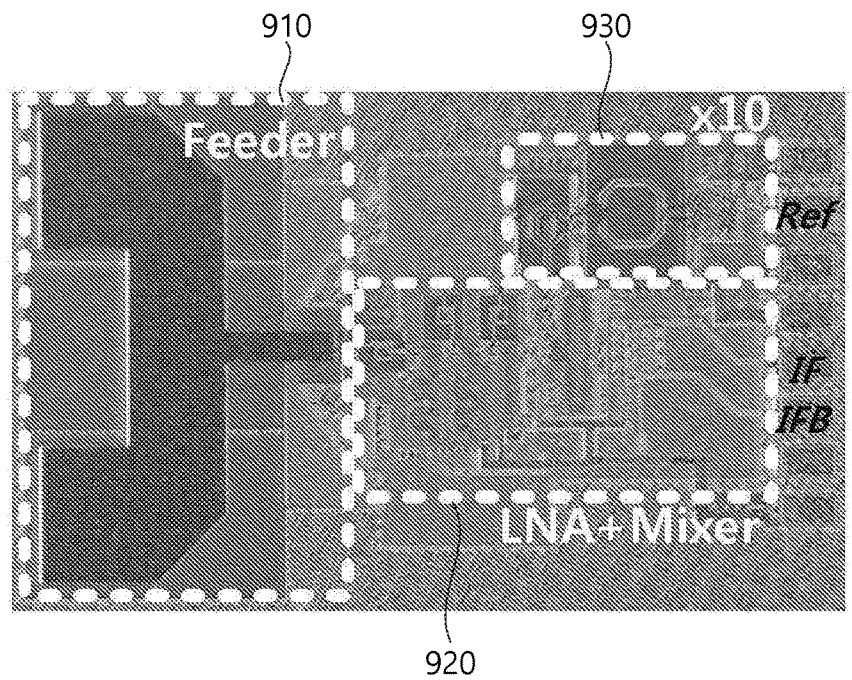
FIG. 9 is a diagram illustrating a manufactured example of a receiver embedding an on-chip waveguide feeder.

FIG. 9 is a diagram illustrating a manufactured example of a receiver embedding an on-chip waveguide feeder.

Referring to FIG. 9, a receiver chip using a waveguide feeder may include a waveguide feeder 910, a low noise amplifier (LNA), a frequency mixer 920, and a frequency divider 930. Similar to the transmitter chip, the receiver chip receives a millimeter wave signal using the waveguide feeder 910 and the frequency divider 930 generates a local oscillation signal. Only a reference signal, a bias, and an IP output of the frequency divider 930 may be transferred through the bonding wire. Accordingly, bonding with high precision for a millimeter wave is not necessary. In this case, the LNA is connected to the waveguide feeder 910 and low-noise amplifies a received signal. The frequency mixer may convert the low-noise amplified signal into a predetermined band.

Figure 10:
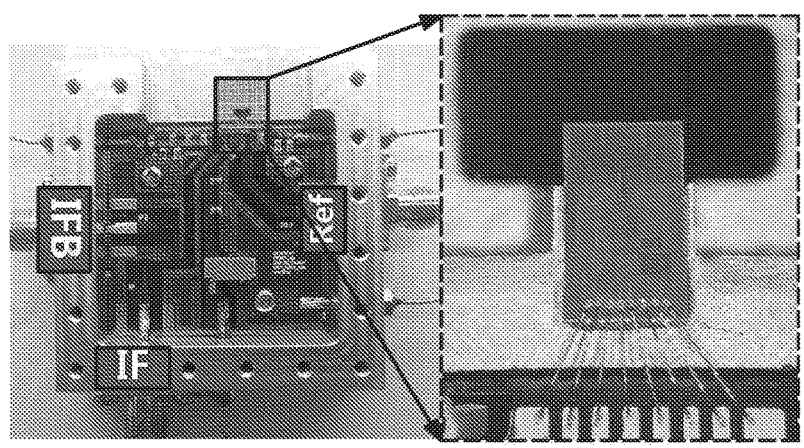
FIG. 10 is a diagram illustrating a mounted example of a waveguide of a reception chip embedding a waveguide feeder and a configuration of a receiver module using the same.

FIG. 10 is a diagram illustrating a mounted example of a waveguide of a reception chip embedding a waveguide feeder and a configuration of a receiver module using the same.

Referring to FIG. 10, a module of a receiving system using the receiver chip may drive the waveguide by positioning a feeder of the receiver chip at an aperture of a waveguide in the same manner as in the transmission module. Referring to a left drawing of FIG. 10, a bias signal may be output to a left side of the receiver module, an IF signal may be output to a left bottom, and a reference signal Ref may be output to a right side. Referring to a right drawing of FIG. 10, a millimeter wave receiver may be configured without input and output of a millimeter wave signal through a separate line by connecting a bonding wire at a low cost to the receiver chip.

Figure 11:
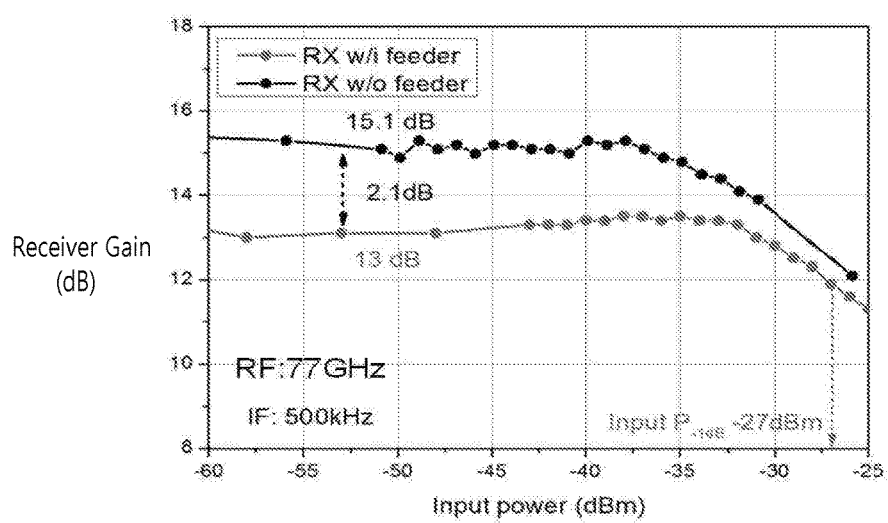
FIG. 11 is a diagram of comparing (wafer measurement) performance of a reception chip embedding an on-chip waveguide feeder with that of a chip embedding a pad.

FIG. 11 is a diagram of comparing (wafer measurement) performance of a reception chip embedding an on-chip waveguide feeder with that of a chip embedding a pad.

Referring to FIG. 11, a gain of a receiver measured in a wafer state using an on-chip pad is compared with a gain measured in an output of a waveguide using a feeder. It may be configured that loss of about 2.1 dB or less is represented.

That is, a structure is simpler and loss is equal to or excellent as compared with a case of implementing a millimeter wave system by bonding a receiver chip to a pad.

Figure 12:
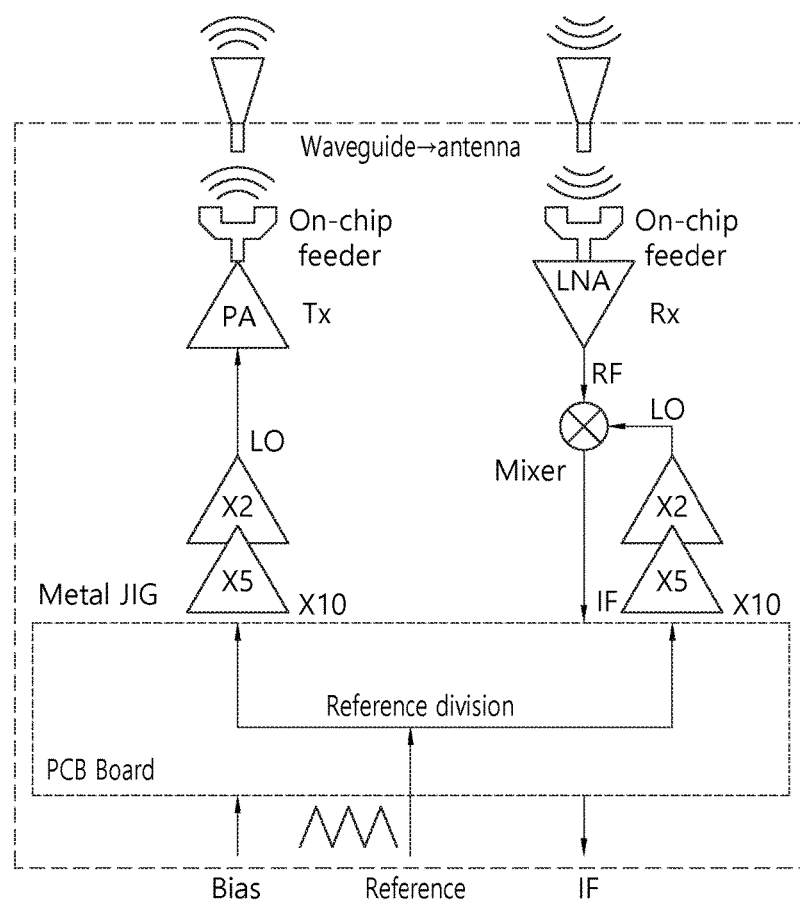
FIG. 12 is a diagram illustrating a structure of an FMCW radar using a transceiving chip embedding an on-chip waveguide feeder.

FIG. 12 is a diagram illustrating a structure of an FMCW radar using a transceiving chip embedding an on-chip waveguide feeder.

Referring to FIG. 12, a frequency modulated continuous-wave (FMCW) radar of transmission 1 channel and reception 1 channel is configured using a transceiving chip embedding a waveguide feeder according to an embodiment of the present invention as illustrated in FIG. 12. In this case, the millimeter wave signal may be transmitted and received to and from a waveguide antenna through the waveguide feeder. Only a reference signal (expressed as a reference) and a bias of the frequency divider may be transferred to an FR4 board using a wire bonding. In a case of a right receiver, an RF signal passing through the low noise amplifier is mixed with a LO signal by a frequency mixer and the mixed signal is output as an IF signal. The IF signal may be output through the FR4 board and the bonding wire. The structure of the transceiver may extend to a multiple channel radar structure by simply increasing the number of waveguide apertures. This will be described with reference to FIG. 13.

Figure 13:
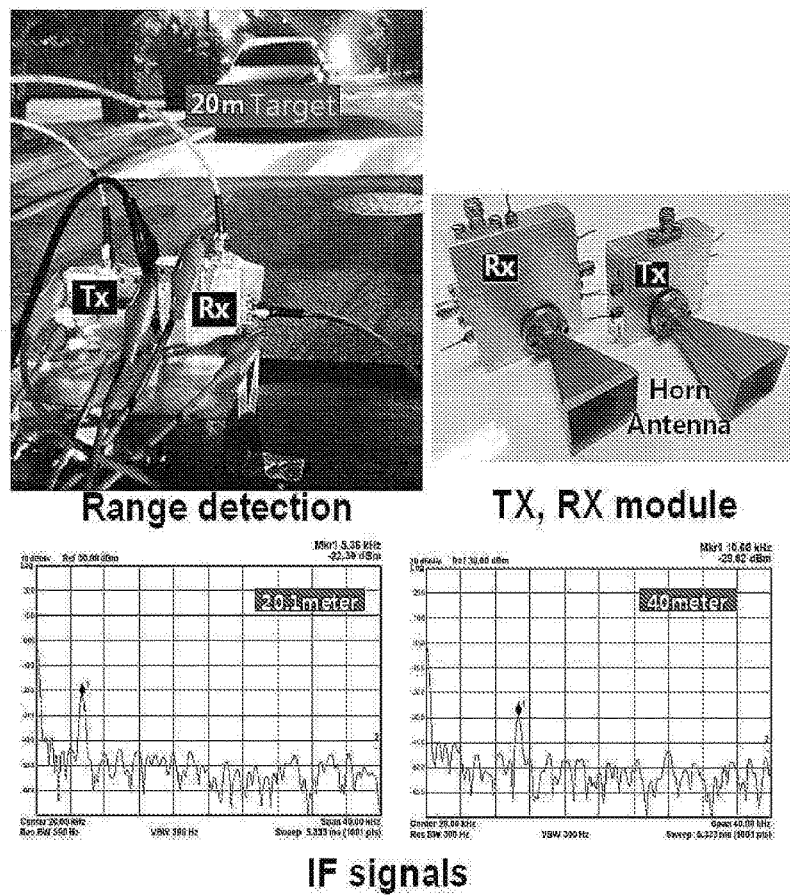
FIG. 13 is a diagram illustrating a 77 GHz radar transceiver module realized by the structure of FIG. 12 and a performance testing result.

FIG. 13 is a diagram illustrating a 77 GHz radar transceiver realized by the structure of FIG. 12 and a performance testing result.

Referring to FIG. 13, FIG. 13 illustrates a 77 GHz FMCW radar configured by a structure of FIG. 12. In particular, a left top drawing illustrates an example of using the 77 GHz FMCW radar as a vehicle radar, which may detect a distance between an IF signal being a difference signal between a transmitted signal and a received signal proportional to a distance of an object and the object. The vehicle radar serves as a distance detecting means and may be used for a smart car and the like. That is, the distance detecting means may detect a distance to a target vehicle forward of a predetermined distance. Further, a right top drawing illustrates a Horn type antenna where one waveguide antenna is applied to a receiver and a transmitter, respectively. A transmitter chip or a receiver chip embedding the waveguide feeder according to the present invention may be used as the Horn type antenna.

Figure 14:
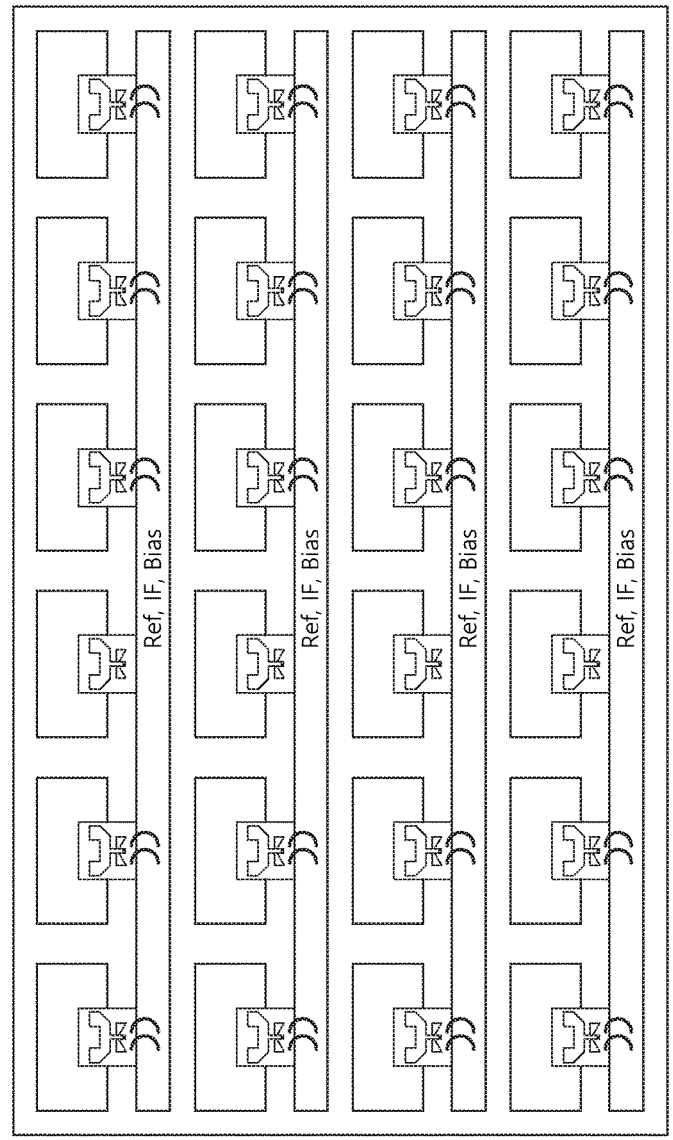
FIG. 14 is a block diagram illustrating a structure of a multi-channel millimeter wave array transceiver using an on-chip waveguide feeder.

FIG. 14 is a block diagram illustrating a structure of a multi-channel millimeter array transceiver using an on-chip waveguide feeder.

Referring to FIG. 14, transceiver chips having an on-chip waveguide feeder structure according to an embodiment of the present invention may be multi-dimensionally arranged. Accordingly, a multi-dimension/multi-channel millimeter wave transceiver may be manufactured. The multi-dimension/multi-channel millimeter wave transceiver serves as an aperture antenna by forming a waveguide aperture on a metal surface and may realize a multi-channel millimeter wave system by arranging a plurality of transceiver chips. Accordingly, a plurality of waveguides serves as an aperture antenna through an aperture. A transceiver chip having a waveguide feeder structure is connected to the waveguide. A predetermined number of transceiving chips may provide a reference signal and a bias signal to one line and may receive an IF signal. A plurality of lines may be also included. A system for transmitting/receiving a multi-channel millimeter wave signal through a plurality of transceiving chips may be configured.

Figure 15:
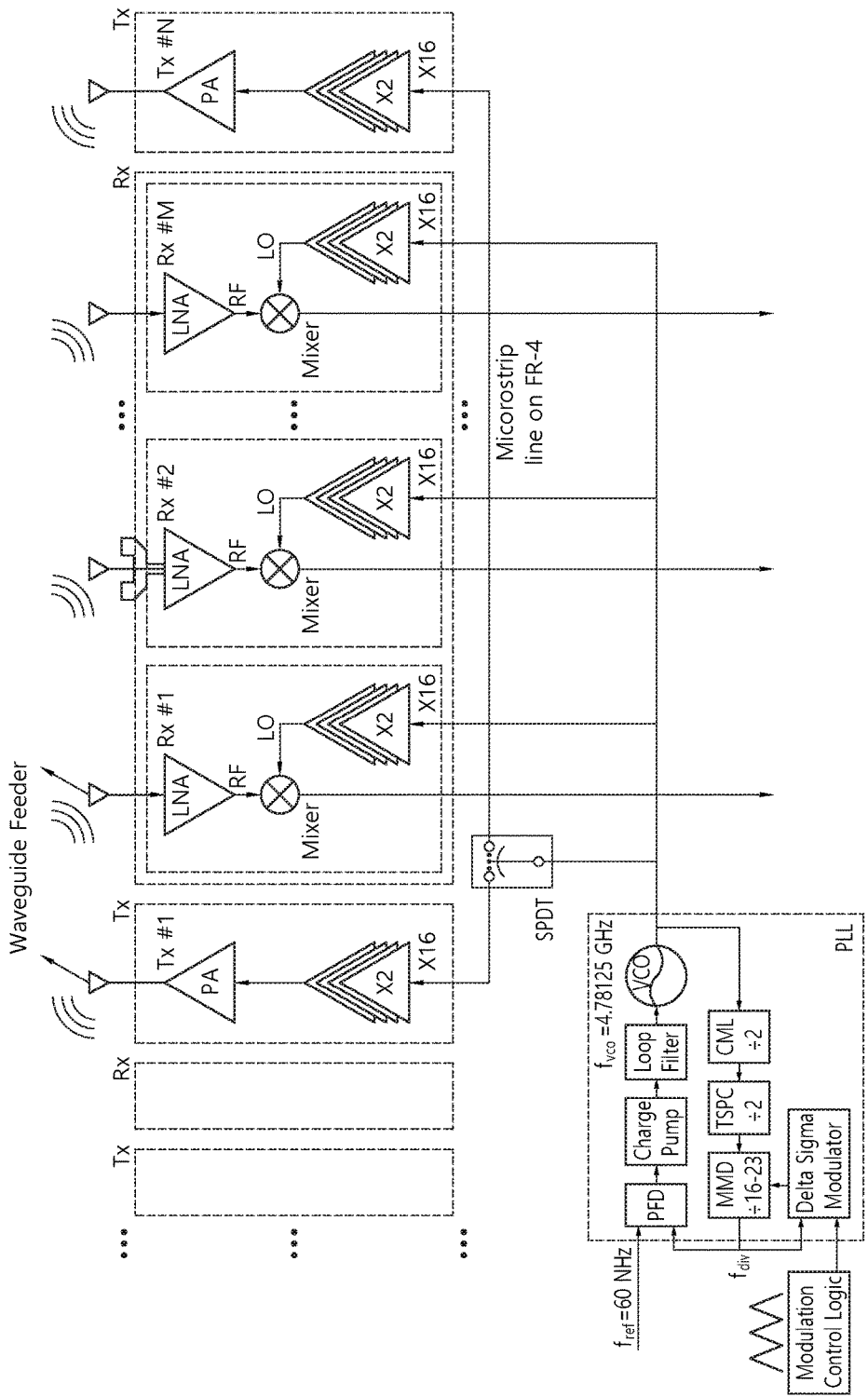
FIG. 15 is a block diagram illustrating a structure of a multiple input and output radar using a chip embedding a waveguide feeder.

FIG. 15 is a block diagram illustrating a structure of a multiple input and output radar using a chip embedding a waveguide feeder.

Referring to FIG. 15, FIG. 15 illustrates a structure of a multi-channel millimeter wave array transceiver as a block diagram. As described above, a plurality of transmitters Tx may be connected to a plurality of receivers Rx through a micro-chip line on an FR-4 board. In this case, waveguide feeders may be connected to a top end of a power amplifier in a transmitter and a top end of a low noise amplifier in a receiver. In this case, a plurality of receivers may be combined with each other to configure one receiver set Rx #1~Rx # N. A plurality of transmitters may be also combined with each other to configure one transmitter set. Each of the transmitter and the receiver may be connected to a phase-locked loop (PLL) circuit and may receive a reference signal.

Figure 16:
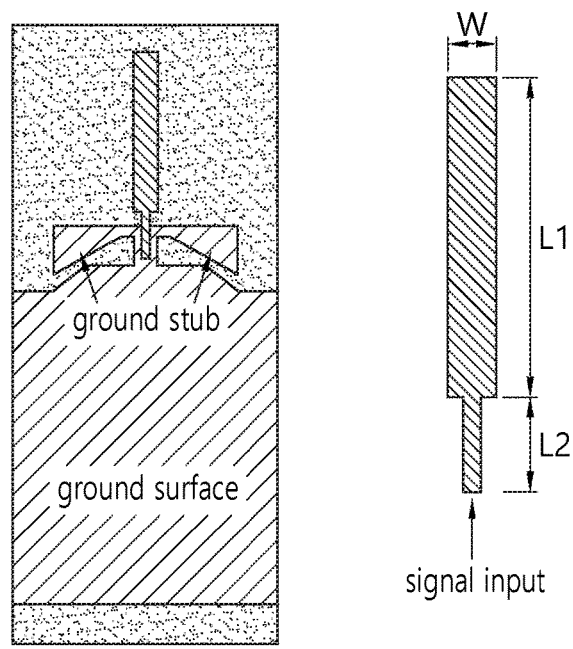
FIG. 16 is a diagram illustrating a structure of an on-chip waveguide feeder using a linear type probe.

FIG. 16 is a diagram illustrating a structure of an on-chip waveguide feeder using a linear type probe. A width W and a length L1, L2 of a single pole probe may be adjusted according to an operation frequency.

Figure 17:
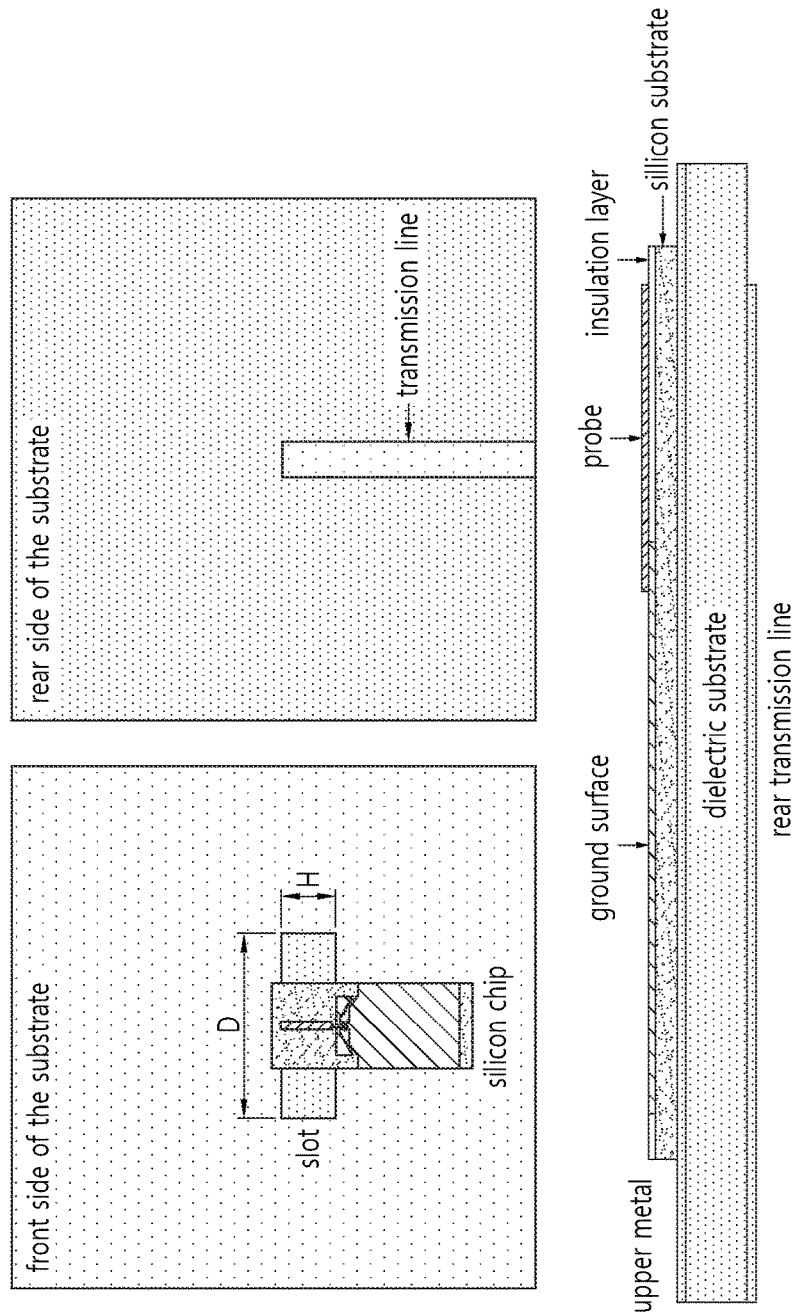
FIG. 17 is a diagram illustrating an embodiment for feeding a metal aperture on a dielectric substrate using the linear type probe shown in FIG. 16.

FIG. 17 is a diagram illustrating an embodiment for feeding a metal aperture on a dielectric substrate using the linear type probe shown in FIG. 16.

Referring to FIG. 17, the aperture may be used as an antenna. When a high gain is required, the aperture may be coupled with a transmission line located at a rear surface of a dielectric substrate to drive a patch array antenna. The size D and H of the aperture may be adjusted according to the operation frequency. The dielectric substrate has a structure where metal layers are formed at top and bottom surfaces of the dielectric substrate and an upper layer in which a chip is located forms an aperture by removing the metal layer to have a rectangular shape, and a microstrip transmission line across the aperture is provided at a rear surface. A length D and a width H of the aperture and a length of the probe may be adjusted according to an operation frequency. A rear transmission line extends through the aperture and an end of the rear transmission line may be used in an open state.

Figure 18:
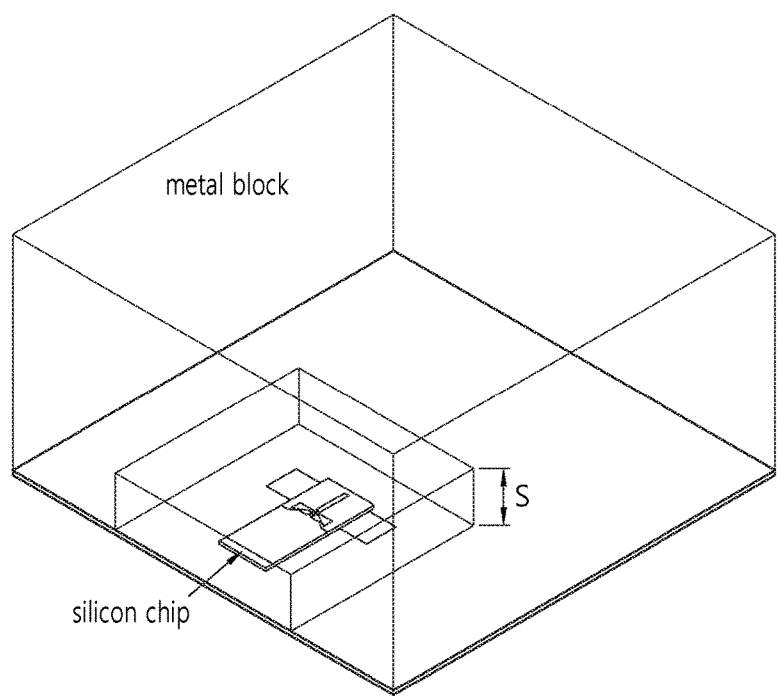
FIG. 18 a diagram illustrating a structure of adding a metal structure including a reflector which is distant from a chip by a predetermined distance S in order to reduce copy on a top surface of a chip in the structure shown in FIG. 17.

FIG. 18 a diagram illustrating a structure of adding a metal structure including a reflector which is distant from a chip by a predetermined distance S in order to reduce copy on a top surface of a chip in the structure shown in FIG. 17.

In the above exemplary systems, although the methods have been described on the basis of the flowcharts using a series of the steps or blocks, the present invention is not limited to the sequence of the steps, and some of the steps may be performed at different sequences from the remaining steps or may be performed simultaneously with the remaining steps. Furthermore, those skilled in the art will understand that the steps shown in the flowcharts are not exclusive and may include other steps or one or more steps of the flowcharts may be deleted without affecting the scope of the present invention.

What is claimed is:

1. A waveguide feeder comprising:
a semiconductor substrate;
a probe located at a semiconductor metal wiring layer to output an electric signal as an electromagnetic wave or to convert the electromagnetic wave into the electric signal; and
an open stub located at a contact surface of an aperture flange in order to form a ground path of the probe on a metallic aperture or a surface of the waveguide flange,
wherein the probe and the open stub are configured on the semiconductor substrate.

2. The waveguide feeder of claim 1, wherein the open stub is configured at a ground surface on the semiconductor substrate which is aligned the contact surface of the waveguide flange.

3. The waveguide feeder of claim 1, wherein the open stub has a butterfly shape or a rectangular shape, and an upper blade of the open stub is aligned parallel to a lower metal surface of the aperture.

4. The waveguide feeder of claim 1, wherein the probe is electrically insulated from the open stub.

5. The waveguide feeder of claim 1, wherein the open stub and the probe are configured by forming a semiconductor wiring layer in a single layer or a multi-layer to be connected to each other through a via, and
the open stub is connected to the semiconductor substrate through a contact via.

6. The waveguide feeder of claim 1, wherein the open stub has a length of L2, the length L2 is adjusted to configure a short circuit with the waveguide flange surface under a chip when a termination of the open stub is viewed from a drive point of a center of the open stub.

7. The waveguide feeder of claim 1, wherein the probe comprises two poles having a U shape at a termination of the probe.

8. The waveguide feeder of claim 7, wherein the probe having the U shape is provided parallel to the open probe facing a top surface of the probe by a predetermined length so that a slot line mode is formed.

9. The waveguide feeder of claim 1, wherein the semiconductor substrate is located at a center of the waveguide aperture rightward and leftward and is aligned at an upper blade surface of the open stub and a bottom surface of the aperture of the waveguide upward and downward.

10. The waveguide feeder of claim 1, wherein a metal reflector is installed at a point spaced apart from the aperture of the waveguide by a predetermined distance D, and the distance D is adjusted according to an operation frequency.

11. The waveguide feeder of claim 1, wherein an aperture having a rectangular shape formed on a metal surface on a dielectric substrate is driven using the probe and is used as an aperture antenna.

12. The waveguide feeder of claim 1, wherein a single pole probe is integrally formed with the open stub.

13. The waveguide feeder of claim 1, wherein the waveguide feeder has a structure to couple a signal with a transmission line located at a rear surface of an aperture by driving an aperture having a rectangular shape formed on a metal surface on a dielectric substrate using a single pole probe.

14. A transmitter module embedding an on-chip waveguide feeder, the transmitter module comprising:
an on-chip waveguide feeder configured to transfer a millimeter wave signal to a waveguide;
a power amplifier connected to the waveguide feeder to amplify a signal; and
a frequency divider configured to receive a reference signal to provide the millimeter wave signal,
wherein waveguide feeder comprises:
a semiconductor substrate;
a probe located at an aperture of a waveguide to input and output an electric signal; and
an open stub located at a contact surface of a waveguide flange in order to form a ground path of the probe on a waveguide flange surface,
wherein the probe and the open stub are configured on the semiconductor substrate.

15. The transmitter module of claim 14, wherein the open stub is configured at a ground surface on the semiconductor substrate which is aligned at the contact surface of the waveguide flange.

16. A receiver module embedding an on-chip waveguide feeder, the receiver module comprising:
- an on-chip waveguide feeder configured to receive a millimeter wave signal;
- a low noise amplifier connected to the waveguide feeder to low-noise amplify the received millimeter wave signal;
- a frequency mixer configured to convert the low-noise amplified signal into a predetermined band; and
- a frequency divider configured to transfer a location oscillation signal of the frequency mixer,
- wherein waveguide feeder comprises:
- a semiconductor substrate;
- a probe located at an aperture of a waveguide to receive an electric signal; and
- an open stub located at a contact surface of a waveguide flange in order to form a ground path of the probe on a waveguide flange surface,
- wherein the probe and the open stub are configured on the semiconductor substrate.

17. The receiver module of claim 16, wherein the open stub is configured at a ground surface on the semiconductor substrate which is aligned at the contact surface of the waveguide flange.

18. A multi-dimensional array transceiver comprising:
- a plurality of waveguides configured to serve as an aperture antenna by forming an aperture at a metal surface; and
- a plurality of transceiving chips having a waveguide feeder structure, the waveguide feeder structure comprises:
- a semiconductor substrate;
- a probe located at an aperture of a waveguide to receive an electric signal; and
- an open stub located at a contact surface of a waveguide flange in order to form a ground path of the probe on a waveguide flange surface,
- wherein the probe and the open stub are configured on the semiconductor substrate.

* * * * *